(12) United States Patent
Omura et al.

(10) Patent No.: US 10,469,053 B2
(45) Date of Patent: Nov. 5, 2019

(54) ELASTIC WAVE DEVICE AND MANUFACTURING METHOD FOR THE SAME

(71) Applicant: Murata Manufacturing Co., Ltd., Nagaokakyo-shi, Kyoto-fu (JP)

(72) Inventors: Masashi Omura, Nagaokakyo (JP); Tetsuya Kimura, Nagaokakyo (JP); Yutaka Kishimoto, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 354 days.

(21) Appl. No.: 15/593,498

(22) Filed: May 12, 2017

(65) Prior Publication Data

US 2017/0250671 A1    Aug. 31, 2017

Related U.S. Application Data

(63) Continuation of application No. PCT/JP2015/082764, filed on Nov. 20, 2015.

(30) Foreign Application Priority Data

Dec. 18, 2014    (JP) ................................ 2014-256263

(51) Int. Cl.
*H03H 9/25* (2006.01)
*H01L 41/09* (2006.01)
(Continued)

(52) U.S. Cl.
CPC .......... *H03H 9/14541* (2013.01); *H03H 3/02* (2013.01); *H03H 3/08* (2013.01);
(Continued)

(58) Field of Classification Search
CPC ........ H03H 9/14541; H03H 3/02; H03H 3/08; H03H 9/02047; H03H 9/02228; H03H 9/25; H03H 2003/021
(Continued)

(56) References Cited

U.S. PATENT DOCUMENTS

2010/0107388 A1* 5/2010 Iwamoto ............... H01L 41/313
29/25.35
2011/0266918 A1    11/2011 Iwamoto et al.
(Continued)

FOREIGN PATENT DOCUMENTS

JP    2012-257019 A    12/2012
JP    2013-214954 A    10/2013
(Continued)

OTHER PUBLICATIONS

Official Communication issued in International Patent Application No. PCT/JP2015/082764, dated Jan. 19, 2016.

*Primary Examiner* — Thomas M Dougherty
(74) *Attorney, Agent, or Firm* — Keating & Bennett, LLP

(57) ABSTRACT

In an elastic wave device, a piezoelectric substrate is laminated on a support substrate including a recess. On one of a first principal surface and a second principal surface of the piezoelectric substrate, a functional electrode including an IDT electrode is provided. Passing-through sections are provided in the piezoelectric substrate and connected to a hollow section enclosed by the recess and the piezoelectric substrate. In a plan view of the piezoelectric substrate seen from the first principal surface, at least a portion of the passing-through sections is inside a minimum rectangular or substantially rectangular region encompassing an outer circumference of a region including the functional electrode.

18 Claims, 9 Drawing Sheets

(51) Int. Cl.
*H03H 9/145* (2006.01)
*H03H 3/08* (2006.01)
*H03H 3/02* (2006.01)
*H03H 9/02* (2006.01)

(52) U.S. Cl.
CPC .... *H03H 9/02047* (2013.01); *H03H 9/02228* (2013.01); *H03H 9/25* (2013.01); *H03H 2003/021* (2013.01)

(58) Field of Classification Search
USPC ............ 310/313 A–313 D, 313 R, 324
See application file for complete search history.

(56) References Cited

U.S. PATENT DOCUMENTS

| | | | |
|---|---|---|---|
| 2012/0205754 A1* | 8/2012 | Iwamoto | H03H 3/02 257/415 |
| 2013/0234805 A1 | 9/2013 | Takahashi | |
| 2014/0009032 A1 | 1/2014 | Takahashi et al. | |
| 2014/0152145 A1* | 6/2014 | Kando | H03H 3/02 310/313 A |
| 2017/0149405 A1* | 5/2017 | Kishimoto | H03H 3/02 |
| 2019/0238114 A1* | 8/2019 | Kishimoto | H03H 9/25 |

FOREIGN PATENT DOCUMENTS

| | | |
|---|---|---|
| JP | 2014-013991 A | 1/2014 |
| WO | 2010/082571 A1 | 7/2010 |
| WO | 2012/073871 A1 | 6/2012 |

\* cited by examiner

ELASTIC WAVE DEVICE AND MANUFACTURING METHOD FOR THE SAME

CROSS REFERENCE TO RELATED APPLICATIONS

This application claims the benefit of priority to Japanese Patent Application No. 2014-256263 filed on Dec. 18, 2014 and is a Continuation Application of PCT Application No. PCT/JP2015/082764 filed on Nov. 20, 2015. The entire contents of each application are hereby incorporated herein by reference.

BACKGROUND OF THE INVENTION

1. Field of the Invention

The present invention relates to elastic wave devices and manufacturing methods for the same.

2. Description of the Related Art

Various types of elastic wave devices using plate waves have been proposed. An elastic wave device making use of plate waves and including a hollow section is disclosed in Japanese Unexamined Patent Application Publication No. 2014-13991 and WO 2012/073871 A1. In Japanese Unexamined Patent Application Publication No. 2014-13991, at a time of forming a hollow section, a sacrificial layer is formed in advance. A piezoelectric thin film is laminated on the sacrificial layer. A through-hole for etching is formed in the piezoelectric thin film. Then, performing etching through the through-hole for etching removes the sacrificial layer, thus forming the hollow section. Also in WO 2012/073871 A1, a similar through-hole for etching is provided in a region in an outer side portion of a reflector.

In the case where a through-hole for etching is provided as described in Japanese Unexamined Patent Application Publication No. 2014-13991 and WO 2012/073871 A1, an area of the piezoelectric thin film becomes larger accordingly. In addition, an area of the sacrificial layer becomes larger as well. In the case where the areas of the piezoelectric thin film, the sacrificial layer, and the like become large, the size of the elastic wave device including a piezoelectric substrate consequently becomes large. Therefore, in order to miniaturize an elastic wave device, it is required to make the areas of a piezoelectric thin film, a sacrificial layer, and the like be small.

SUMMARY OF THE INVENTION

Preferred embodiments of the present invention provide elastic wave devices that are able to be miniaturized by appropriately setting a position of a through-hole for etching, and provide manufacturing methods for such elastic wave devices.

An elastic wave device according to a preferred embodiment of the present invention includes a support substrate including an upper surface on which a recess is provided; a piezoelectric substrate including a first principal surface and a second principal surface opposing each other, and laminated so as to cover the recess of the support substrate from the second principal surface side; and a functional electrode for an elastic wave device which is provided on one of the first and second principal surfaces of the piezoelectric substrate and includes at least an interdigital transducer (IDT) electrode that generates elastic waves, and through which the elastic waves propagate. In the elastic wave device, the recess of the support substrate is covered with the piezoelectric substrate to define a hollow section; a passing-through section passing through the first and second principal surfaces of the piezoelectric substrate is provided in the piezoelectric substrate; the passing-through section is connected to the hollow section; and at least a portion of the passing-through section is positioned inside a minimum rectangular or substantially rectangular region encompassing an outer circumference of a region in which the functional electrode is located in plan view from the first principal surface side of the piezoelectric substrate.

In a certain specific aspect of an elastic wave device according to a preferred embodiment of the present invention, at least a portion of the passing-through section is positioned in an end portion in an elastic wave propagation direction inside the rectangular region. In this case, a decrease in excitation efficiency of elastic waves is unlikely to occur.

In another specific aspect of an elastic wave device according to a preferred embodiment of the present invention, the functional electrode preferably does not include a reflector.

In another specific aspect of an elastic wave device according to a preferred embodiment of the present invention, the passing-through section is disposed in a region between electrode fingers of the IDT electrode that are adjacent to each other. Because the passing-through section is disposed in a region between the electrode fingers that are adjacent to each other, a decrease in excitation efficiency of elastic waves with the IDT electrode is unlikely to occur.

In another specific aspect of an elastic wave device according to a preferred embodiment of the present invention, the functional electrode further includes a pair of reflectors disposed on both sides in the elastic wave propagation direction of the IDT electrode.

In another specific aspect of an elastic wave device according to a preferred embodiment of the present invention, the passing-through section is provided in at least one of a region between the electrode fingers of the IDT electrode that are adjacent to each other and a region between electrode fingers of the reflector that are adjacent to each other. In this case, a function of the IDT electrode and/or a function of the reflector is unlikely to be degraded.

In another specific aspect of an elastic wave device according to a preferred embodiment of the present invention, the IDT electrode includes first and second busbars opposing each other and first and second electrode fingers electrically connected to the first and second busbars respectively, and the first and second busbars extend in a direction intersecting with the elastic wave propagation direction. In this manner, the first and second busbars may extend not in a direction parallel to the elastic wave propagation direction, but in a direction intersecting with the elastic wave propagation direction.

In still another specific aspect of an elastic wave device according to a preferred embodiment of the present invention, the rectangular region is larger than a region in which the functional electrode is provided, and at least a portion of the passing-through section is disposed in an outer side portion of the functional electrode for an elastic wave device. In this case, a function of the functional electrode for an elastic wave device is unlikely to be degraded.

A manufacturing method for an elastic wave device according to a preferred embodiment of the present invention includes forming, on a first principal surface of a piezoelectric substrate including the first principal surface and a second principal surface opposing each other, a functional electrode for an elastic wave device which includes an IDT electrode that generates elastic waves, and through which the elastic waves propagate; forming a sacrificial layer on the second principal surface of the piezoelectric substrate; laminating a support substrate on the second principal surface side of the piezoelectric substrate so that the support substrate makes contact with the sacrificial layer; forming a passing-through section in the piezoelectric substrate; and forming a hollow section by performing etching through the passing-through section so as to eliminate the sacrificial layer, wherein, in the forming of the passing-through section, the passing-through section is formed so that at least a portion of the passing-through section is positioned inside a minimum rectangular or substantially rectangular region encompassing an outer circumference of a region in which the functional electrode is formed in plan view from the first principal surface side of the piezoelectric substrate.

In a certain specific aspect of a manufacturing method for an elastic wave device according to a preferred embodiment of the present invention, the functional electrode further includes a pair of reflectors disposed on both sides in an elastic wave propagation direction of the IDT electrode.

With the elastic wave devices and the manufacturing methods therefor according to various preferred embodiments of the present invention, at least a portion of the passing-through section is positioned inside the minimum rectangular or substantially rectangular region, thus making it possible to miniaturize the elastic wave device.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, the present invention will be clarified through description of specific preferred embodiments of the present invention with reference to the drawings.

It is to be noted that the preferred embodiments described in the present specification are merely examples and configurations thereof can be partly replaced or combined between different preferred embodiments.

Figure 1A:
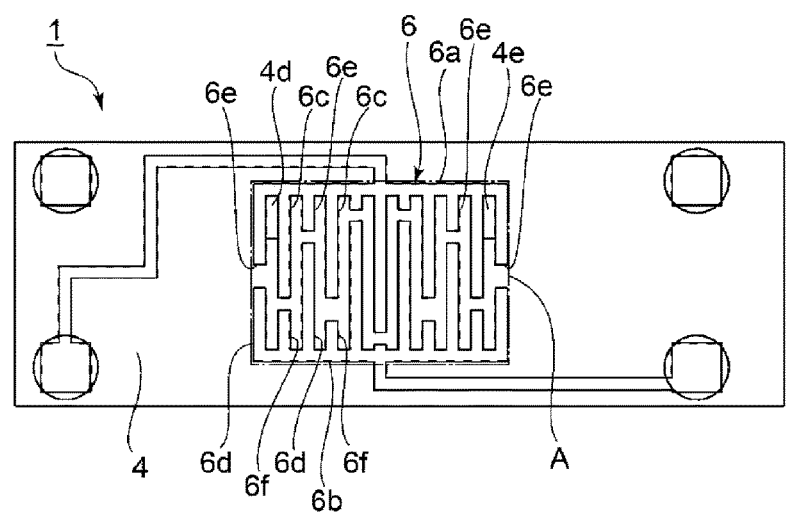
FIGS. 1A and 1B are respectively a plan view and a partially cutout cross-sectional front view of an elastic wave device according to a first preferred embodiment of the present invention.
Figure 1B:
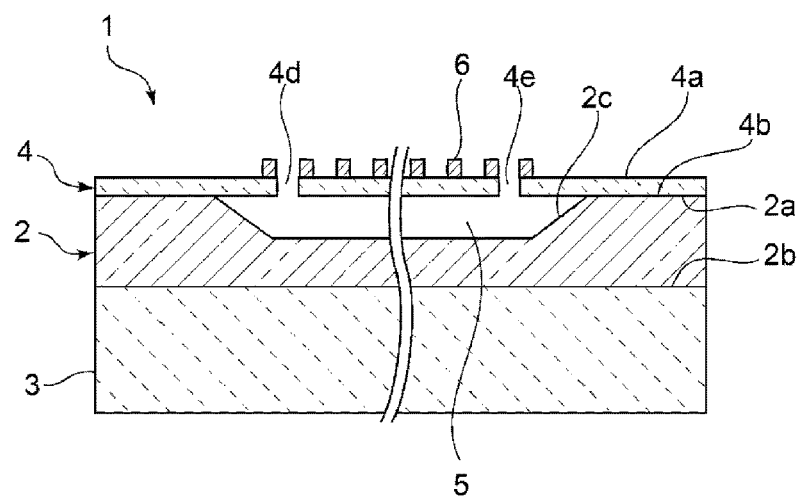

FIGS. 1A and 1B are respectively a plan view and a partially cutout cross-sectional front view of an elastic wave device according to a first preferred embodiment of the present invention.

An elastic wave device 1 is an elastic wave device structured to generate and use Lamb waves as a plate wave, for example. The elastic wave device 1 includes a support substrate 2. The support substrate 2 includes an upper surface 2a and a lower surface 2b. In the upper surface 2a, there is provided a recess 2c that is opened toward the upper surface 2a. The support substrate 2 can include an appropriate dielectric such as silicon oxide, aluminum nitride, alumina, or the like, or such as Si.

A reinforcement substrate 3 is laminated on the lower surface 2b of the support substrate 2. The reinforcement substrate 3 is not absolutely necessary. The reinforcement substrate 3 may be omitted if strength of the support substrate 2 is sufficiently large. The reinforcement substrate 3 can include an appropriate dielectric such as silicon oxide, aluminum oxide or aluminum nitride, or a semiconductor formed with Si or the like.

A piezoelectric substrate 4 is laminated on the upper surface 2a of the support substrate 2. The piezoelectric substrate 4 is thin, that is, is a thin film with a thickness of about $0.05\lambda$ to about $1\lambda$, for example. This makes it possible to sufficiently excite plate waves. Note that an optimum value of thickness of the piezoelectric substrate differs depending on the material of the substrate, the structure thereof, modes of the plate waves, and so on.

The piezoelectric substrate 4 includes $LiTaO_3$. The piezoelectric substrate 4 may include another piezoelectric single crystal.

The piezoelectric substrate 4 includes a first principal surface 4a and a second principal surface 4b opposing each other. The piezoelectric substrate 4 is laminated on the upper surface 2a of the support substrate 2 from the second principal surface 4b side. Accordingly, the piezoelectric substrate 4 covers the recess 2c. With this, a hollow section 5 enclosed by the recess 2c and the piezoelectric substrate 4 is provided.

On the first principal surface 4a of the piezoelectric substrate 4, there is provided an IDT electrode 6 as a functional electrode for an elastic wave device. The IDT electrode 6 includes an appropriate metal or alloy. As the metal or alloy, a metal such as Al, Cu, Ag, Pt, Ti, Fe, Mo, Ta, W, Cr, Ni or the like, or an alloy containing these metals can be used. It is preferable to use Al or an Al-based alloy. The Al-based alloy preferably is an alloy containing more than 50 wt % of Al. The IDT electrode 6 may be an electrode formed by laminating these metals.

As disclosed in WO 2012/073871, with the above-discussed structure, a second-order mode of plate waves is able to be efficiently generated by selecting Euler Angles of LiTaO$_3$ in a specified range.

The elastic wave device 1 preferably includes passing-through sections 4d and 4e in specified regions in the piezoelectric substrate 4. This makes it possible to reduce a plane area and realize miniaturization in the elastic wave device 1, which will be explained in detail below.

The IDT electrode 6 includes a first busbar 6a and a second busbar 6b opposing the first busbar 6a. One end of each of a plurality of first electrode fingers 6c is connected to the first busbar 6a. One end of each of a plurality of second electrode fingers 6d is connected to the second busbar 6b. The first electrode fingers 6c and the second electrode fingers 6d are alternately inserted into each other.

Further, a first dummy electrode finger 6e is spaced from a leading end of the second electrode finger 6d with a gap interposed therebetween. One end of the first dummy electrode finger 6e is connected to the first busbar 6a. Likewise, a second dummy electrode finger 6f is spaced from a leading end of the first electrode finger 6c with a gap interposed therebetween. One end of the second dummy electrode finger 6f is connected to the second busbar 6b.

In the elastic wave device 1, an elastic wave propagation direction is a direction perpendicular or substantially perpendicular to a direction in which the first and second electrode fingers 6c and 6d extend. The passing-through sections 4d and 4e are each provided in a region between the electrode fingers that are adjacent to each other in the elastic wave propagation direction.

Here, the electrode fingers that are adjacent to each other include not only the first and second electrode fingers 6c and 6d, but also the first and second dummy electrode fingers 6e and 6f.

To be more specific, the passing-through section 4d is provided in a region between the first dummy electrode finger 6e on the outermost side in the elastic wave propagation direction and the first electrode finger 6c positioned on the inner side thereof. The passing-through section 4e is provided in a region between another first dummy electrode finger 6e on the outermost side in the elastic wave propagation direction and another first electrode finger 6c positioned on the inner side thereof.

The passing-through sections 4d and 4e are used as etching holes in a process of forming the hollow section 5. As is apparent from a manufacturing process to be explained later, a sacrificial layer is formed to fill the recess 2c, and then the piezoelectric substrate 4 is laminated; thereafter, an etchant is introduced through the passing-through sections 4d and 4e so as to remove the sacrificial layer.

In Japanese Unexamined Patent Application Publication No. 2014-13991 and WO 2012/073871 A1 discussed before, a through-hole as an etching hole is provided in a region in an outer side portion of a minimum rectangular or substantially rectangular region encompassing an outer circumference of a region in which an IDT electrode, reflectors, and the like are formed. Because of this, areas of the piezoelectric substrate, the sacrificial layer, and the like become large, and as a result the size of the elastic wave device 1 becomes undesirably large.

Figure 12A:
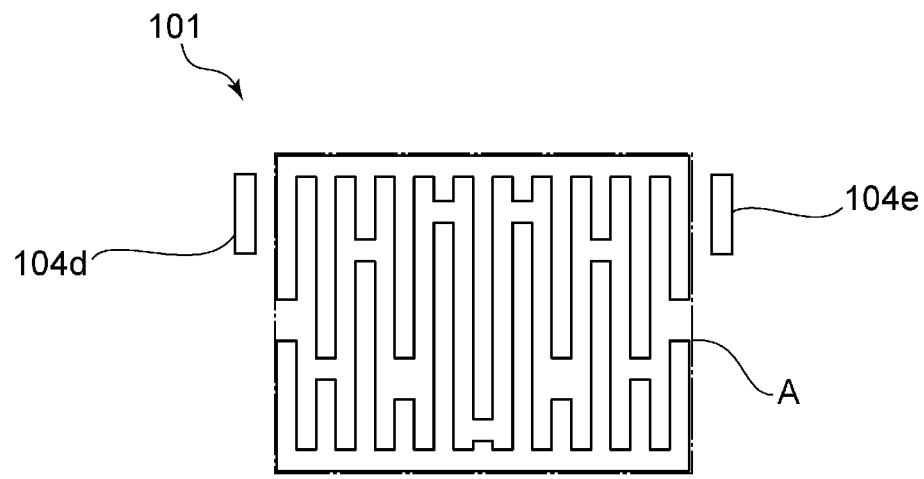
FIG. 12A is a schematic plan view illustrating a main portion of an elastic wave device of a comparative example.
Figure 12B:
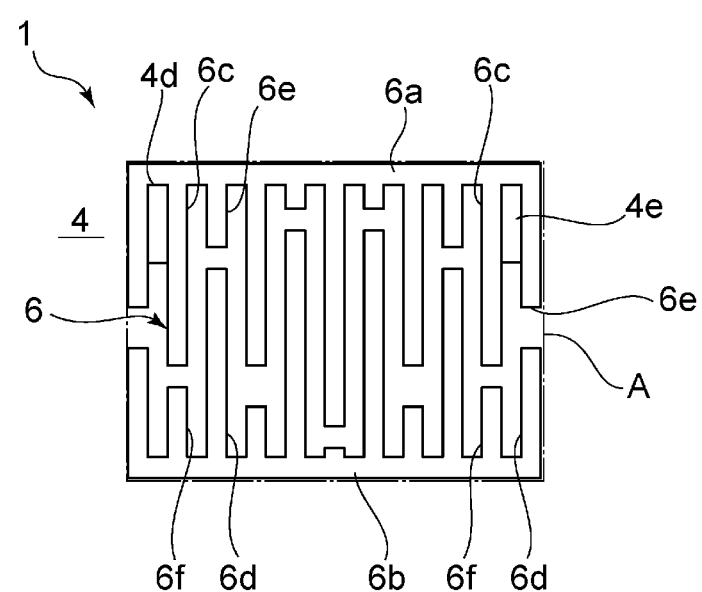
FIG. 12B is a schematic plan view illustrating a main portion of the elastic wave device of the first preferred embodiment of the present invention.

In contrast, in the elastic wave device 1 of the present preferred embodiment, the passing-through sections 4d and 4e are each positioned inside a minimum rectangular or substantially rectangular region A encompassing an outer circumference of a region in which the IDT electrode 6 as a functional electrode for an elastic wave device is formed. As is apparent by comparing a comparative example shown in FIG. 12A with the present preferred embodiment shown in FIG. 12B, the elastic wave device is able to be miniaturized in the present preferred embodiment in comparison with the comparative example equivalent to an example of the existing technique. Note that in an elastic wave device 101 of the comparative example shown in FIG. 12A, passing-through sections 104d and 104e are each positioned in an outer side portion of a minimum rectangular or substantially rectangular region A.

In particular, in the elastic wave device 1, the passing-through sections 4d and 4e are each provided in a region between the electrode fingers that are adjacent to each other inside the minimum rectangular or substantially rectangular region A encompassing the IDT electrode, and are not present in a region where the electrode finger is present. Accordingly, even if the passing-through sections 4d and 4e are provided, the function of the IDT electrode 6 as an electrode is unlikely to be obstructed. This makes it possible to realize the miniaturization without noticeably decreasing the excitation efficiency of plate waves.

As in the elastic wave device 1, in the case where the first busbar 6a and the second busbar 6b are parallel or substantially parallel to the elastic wave propagation direction, the minimum rectangular or substantially rectangular region A is a region connecting an outer circumference of the IDT electrode 6. In this case, sides in outer side portions of the first busbar 6a and the second busbar 6b (sides in the outer side portions of the respective busbars in a direction perpendicular or substantially perpendicular to the elastic wave propagation direction) define a pair of sides of the rectangular region A. Then, a side connecting one end of each of the sides in the outer side portions of the first busbar 6a and the second busbar 6b and a side connecting the other ends thereof configure another pair of sides of the rectangular region A. As such, the minimum rectangular or substantially rectangular region A includes a pair of sides parallel or substantially parallel to the elastic wave propagation direction, although not specifically limited thereto.

In general, a direction perpendicular or substantially perpendicular to a lengthwise direction of the electrode fingers of the IDT electrode corresponds to the elastic wave propagation direction.

In the elastic wave propagation direction, energy of the elastic waves becomes larger toward an inner side portion of the IDT electrode 6 and smaller toward an outer side portion thereof. Therefore, the excitation efficiency is likely to be higher in the first preferred embodiment than that in a second preferred embodiment to be explained later. The same can be applied to third to eighth preferred embodiments to be explained later; that is, the excitation efficiency is able to be improved in the case where a passing-through section is located at a position in an outer side direction of the IDT electrode (an end portion side in the elastic wave propagation direction inside the rectangular region A).

Although two passing-through sections 4d and 4e are preferably provided in the first preferred embodiment, the number of passing-through sections may be one or more than two. The same can be applied to the second to eighth preferred embodiments and a manufacturing process of the elastic wave device 1, which will be explained later.

Hereinafter, elastic wave devices according to second to eighth preferred embodiments of the present invention will be respectively described with reference to FIGS. 2 to 8.

A portion in which an IDT electrode as a functional electrode for an elastic wave device is provided or a portion in which an IDT electrode and reflectors are provided is illustrated in a schematic plan view in each of FIGS. 2 to 8.

Figure 2:
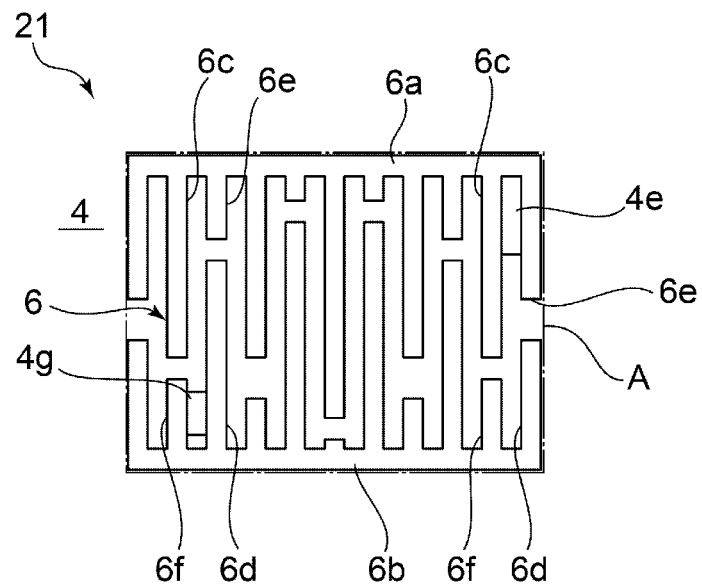
FIG. 2 is a schematic plan view of a portion provided in an IDT electrode of an elastic wave device according to a second preferred embodiment of the present invention.

In an elastic wave device 21 of the second preferred embodiment, an IDT electrode 6 similar to the IDT electrode of the first preferred embodiment is provided on a piezoelectric substrate 4 as shown in FIG. 2. The second preferred embodiment differs from the first preferred embodiment in a point that a passing-through section 4g, in place of the passing-through section 4d, is provided in a region between electrode fingers on an inner side relative to a region between electrode fingers on the outermost side in the elastic wave propagation direction inside a minimum rectangular or substantially rectangular region A encompassing the IDT electrode 6. Other points regarding the elastic wave device 21 are preferably the same or substantially the same as those regarding the elastic wave device 1 of the first preferred embodiment.

Like the passing-trough section 4g, a passing-through section is able to be provided inside the minimum rectangular or substantially rectangular region A encompassing the IDT electrode 6.

Further, because the passing-through section 4g is present in an outer side portion of an intersection region, the miniaturization is able to be realized without noticeably decreasing the excitation efficiency of elastic waves.

Figure 3:
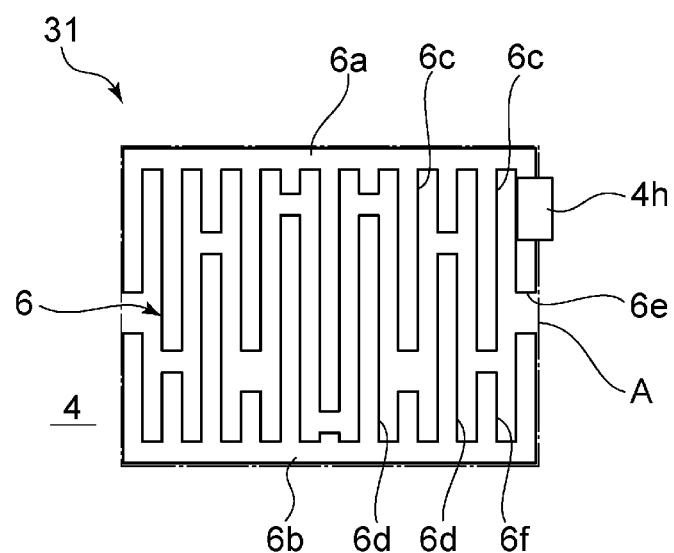
FIG. 3 is a schematic plan view of a portion provided in an IDT electrode of an elastic wave device according to a third preferred embodiment of the present invention.

FIG. 3 is a schematic plan view illustrating a region in which an IDT electrode 6 of an elastic wave device 31 of the third preferred embodiment. An IDT electrode 6 is provided on a piezoelectric substrate 4 in the elastic wave device 31 of the third preferred embodiment. A passing-through section 4h is provided in an end portion in the elastic wave propagation direction inside a minimum rectangular or substantially rectangular region A encompassing the IDT electrode 6. A portion of a first dummy electrode finger 6e is omitted in a portion where the passing-through section 4h is provided. However, even if a portion of the first dummy electrode finger 6e is omitted, the excitation efficiency brought by the IDT electrode 6 is not noticeably decreased.

Further, not all the passing-through section 4h is positioned inside the rectangular region A, and at least a portion of the passing-through section 4h is positioned inside the rectangular region A. The miniaturization is more preferably realized in the case where over half the passing-through section 4h is present inside the rectangular region A than in the case where over half the passing-through section 4h is present outside the rectangular region A. Accordingly, in order to realize the miniaturization, it is preferable that over half the passing-through section 4h be present inside the rectangular region A. However, from the standpoint of excitation efficiency, it is preferable that over half the passing-through section 4h be present outside the rectangular region A.

Although a single passing-through section 4h is provided in FIG. 3, it is preferable that one or more passing-through sections be additionally provided in the case where the passing-through sections are used as etching holes.

Figure 4:
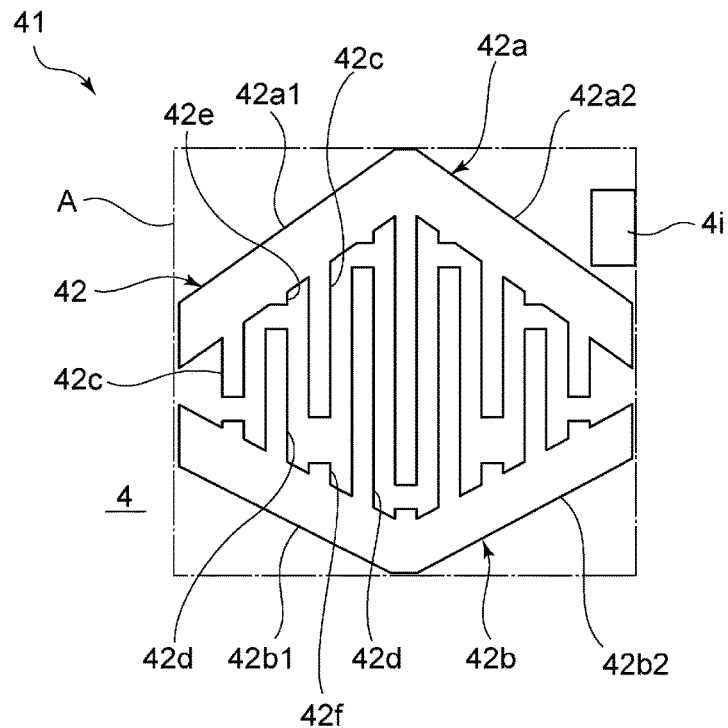
FIG. 4 is a schematic plan view of a portion provided in an IDT electrode of an elastic wave device according to a fourth preferred embodiment of the present invention.

FIG. 4 is a schematic plan view illustrating a portion in which an IDT electrode 42 of an elastic wave device 41 of the fourth preferred embodiment is provided. In the elastic wave device 41, the IDT electrode 42 is provided on a piezoelectric substrate 4. The IDT electrode 42 includes a first busbar 42a and a second busbar 42b. One end of a first electrode finger 42c is connected to the first busbar 42a. One end of a second electrode finger 42d is connected to the second busbar 42b. Also in this preferred embodiment, first and second dummy electrode fingers 42e and 42f are provided being spaced by a gap from each of the leading ends of the second and first electrode fingers 42d and 42c, respectively.

The elastic wave device 41 of the present preferred embodiment differs from the elastic wave device 1 in that the first busbar 42a and the second busbar 42b are not parallel to the elastic wave propagation direction. To be more specific, the first busbar 42a includes a first busbar section 42a1 that extends in a direction intersecting with the elastic wave propagation direction and is slanted to extend toward an outer side portion in a direction in which the electrode fingers extend as it progresses from one end in the elastic wave propagation direction toward the center of the IDT electrode 42. A second busbar section 42a2 is continuously linked to the first busbar section 42a1. The second busbar section 42a2 extends to approach the center in a direction in which the electrode fingers extend as it progresses from the center of the IDT electrode 42 in the elastic wave propagation direction toward an end portion in the elastic wave propagation direction.

The first busbar section 42a1 and the second busbar section 42a2 are line-symmetrical with respect to a center line extending in a direction in which the electrode finger extends while passing through the center in the elastic wave propagation direction of the IDT electrode 42.

Likewise, the second busbar 42b includes a first busbar section 42b1 and a second busbar section 42b2. Accordingly, an outer shape of the IDT electrode 42 is preferably rhombic or substantially rhombic.

A minimum rectangular or substantially rectangular region A encompassing the IDT electrode 42 is indicated by a dot-dash line. A passing-through section 4i is provided inside the rectangular region A. As is apparent from FIG. 4, since the outer shape of the IDT electrode 42 is rhombic, a certain size of space is present in an outer side portion of the second busbar section 42a2. As such, the passing-through section 4i is able to be disposed in the above-described space. Also in this case, the miniaturization is able to be realized because the passing-through section 4i is provided inside the minimum rectangular or substantially rectangular region A encompassing the IDT electrode 42.

Also in this preferred embodiment, the passing-through section 4i is positioned in an end portion in the elastic wave propagation direction inside the rectangular region A. Accordingly, like the elastic wave device 31 of the third preferred embodiment, the miniaturization is able to be realized without noticeably lowering the excitation efficiency.

In the elastic wave devices 1, 21, 31, and 41 of the first to fourth preferred embodiments, apodization weighting is performed on the IDT electrodes 6 and 42. Note that, however, the apodization weighting may not be performed on the IDT electrodes in a preferred embodiment of the present invention.

Further, the passing-through section 4i may be provided in a region between the electrode fingers that are adjacent to each other within the IDT electrode 42.

Furthermore, the elastic wave devices 1, 21, 31, and 41 of the first to fourth preferred embodiments include the IDT electrode 6 or the IDT electrode 42, but do not include reflectors. The elastic wave devices of various preferred embodiments of the present invention may be provided with reflectors on both sides in the elastic wave propagation direction of the IDT electrode.

Figure 5:
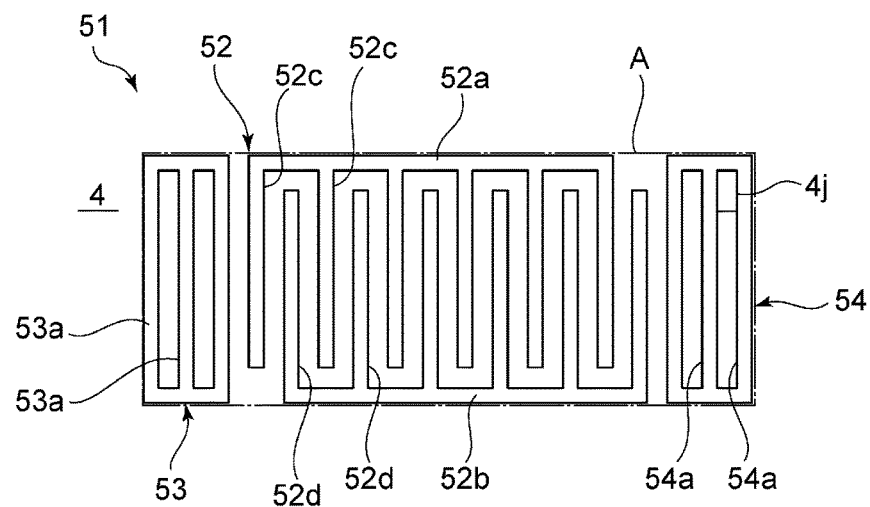
FIG. 5 is a schematic plan view of a portion provided in an IDT electrode of an elastic wave device according to a fifth preferred embodiment of the present invention.

FIG. 5 is a schematic plan view illustrating a region in which an IDT electrode and reflectors are provided in an elastic wave device of the fifth preferred embodiment.

In an elastic wave device 51, reflectors 53 and 54 are provided on both sides in the elastic wave propagation direction of an IDT electrode 52. The IDT electrode 52 includes first and second busbar sections 52a and 52b extending parallel or substantially parallel to the elastic wave propagation direction. Each one end of a plurality of first electrode fingers 52c is connected to the first busbar section 52a. Each one end of a plurality of second electrode fingers 52d is connected to the second busbar 52b. The plurality of first electrode fingers 52c and the plurality of second electrode fingers 52d are alternately inserted into each other. Apodization weighting is not performed on the IDT electrode 52; that is, the IDT electrode 52 is a normal-type IDT electrode.

The reflectors 53 and 54 are grating reflectors in which both ends of a plurality of electrode fingers 53a are short-circuited and both ends of a plurality of electrode fingers 54a are short-circuited, respectively.

The IDT electrode 52 as well as the reflectors 53 and 54, defining and functioning as a functional electrode for an elastic wave device, are provided on a piezoelectric substrate 4. The functional electrode broadly includes electrodes that function so as to make elastic waves propagate. Therefore, not only the IDT electrode 52 that generates elastic waves but also the reflectors 53 and 54 through which elastic waves propagate and from which the elastic waves are reflected are included in the functional electrode.

In the elastic wave device 51, a rectangular region A is a minimum rectangular or substantially rectangular region encompassing a portion in which the IDT electrode 52 and the reflectors 53, 54 are provided.

A passing-through section 4j is positioned inside a region where the reflector 54 is provided in the elastic wave device 51. Because the passing-through section 4j is provided inside the rectangular region A, the miniaturization is able to be realized also in the elastic wave device 51.

In particular, the passing-through section 4j is positioned not on the electrode finger, but in a region between the electrode fingers that are adjacent to each other in the reflector 54. This makes it difficult to affect propagation characteristics of the elastic waves.

Further, the passing-through section 4j is located at a position in an outer side direction of the reflector, that is, on an end portion side in the elastic wave propagation direction inside the rectangular region A, thus improving the reflection efficiency.

The passing-through section 4j may be provided inside a region where the reflector 53 is provided. Moreover, the passing-through section 4j may be provided inside a region where the IDT electrode 52 is provided.

Also in the case where the passing-through section 4j is provided within the IDT electrode 52, by arranging the passing-through section 4j not on the electrode finger but in a region between the electrode fingers that are adjacent to each other, the design is able to be configured so as not to affect the propagation characteristics of elastic waves.

Figure 6:
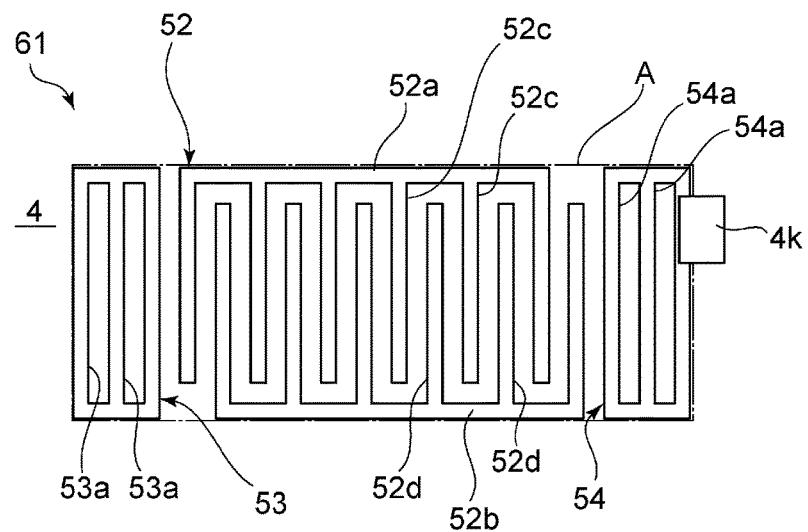
FIG. 6 is a schematic plan view of a portion provided in an IDT electrode of an elastic wave device according to a sixth preferred embodiment of the present invention.

FIG. 6 is a schematic plan view illustrating a portion in which provided is a functional electrode for an elastic wave device of an elastic wave device 61 according to the sixth preferred embodiment. In the elastic wave device 61, an IDT electrode 52 and reflectors 53, 54 are configured in the same manner as in the elastic wave device 51. The elastic wave device 61 differs from the elastic wave device 51 in that a passing-through section 4k is provided on a boundary portion of a rectangular region A (a portion extending from an outer side portion of the rectangular region A to the inside of the rectangular region A). In other words, a portion of the passing-through section 4k is positioned inside the rectangular region A. As described above, only a portion of the passing-through section 4k may be positioned inside the rectangular region A. As an example of this case, a structure in which a portion of the reflector 53 or 54, that is, a portion on an end portion side in the elastic wave propagation direction inside the rectangular section A is made to be a dummy electrode is provided, for example. In such case, a portion of the dummy electrode may be omitted, and the passing-through section 4k may be provided in the omitted portion.

Figure 7:
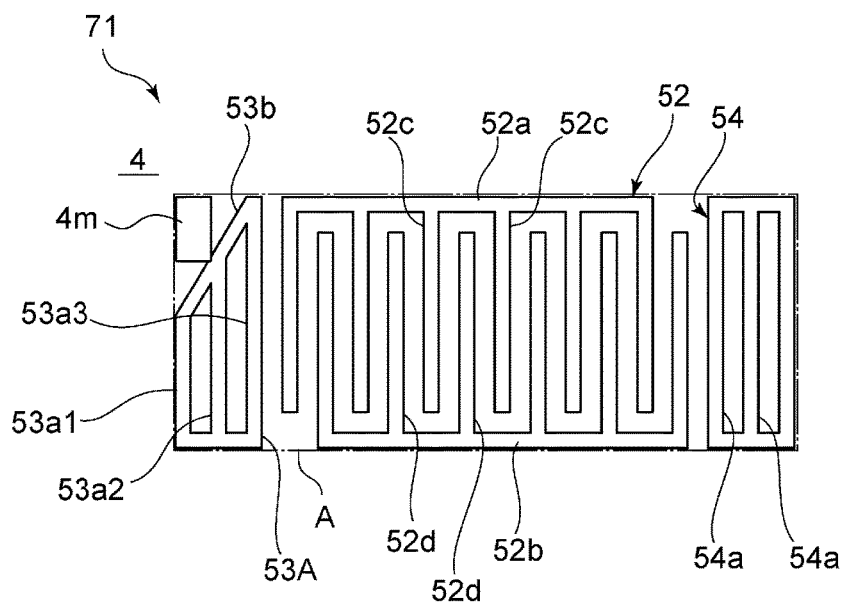
FIG. 7 is a schematic plan view of a portion provided in an IDT electrode of an elastic wave device according to a seventh preferred embodiment of the present invention.

In an elastic wave device 71 of the seventh preferred embodiment shown in FIG. 7, one reflector 53A preferably has a structure in which both ends of electrode fingers 53a1, 53a2, and 53a3 including mutually different lengths are short-circuited. As such, a short-circuiting section 53b on one end side of the reflector 53A in a direction in which its electrode fingers extend extends in a direction obliquely intersecting with the elastic wave propagation direction. Accordingly, the reflector 53A preferably has a trapezoidal shape taking the electrode fingers 53a1 and 53a3 as an upper base and a lower base, respectively. As such, a certain size of space is present at a position in an outer side portion of the short-circuiting section 53b and also inside a rectangular region A. A passing-through section 4m is provided in this space.

As described above, a reflector whose outer shape is not rectangular, like the reflector 53A, may be used. In this case, the passing-through section 4m can include ease in an outer side portion of the reflector 53A inside the minimum rectangular or substantially rectangular region A.

The passing-through section 4m may be provided in a region between the electrode fingers that are adjacent to each other in the IDT electrode 52, or in a region between the electrode fingers that are adjacent to each other in the reflector 53A or a reflector 54.

Figure 8:
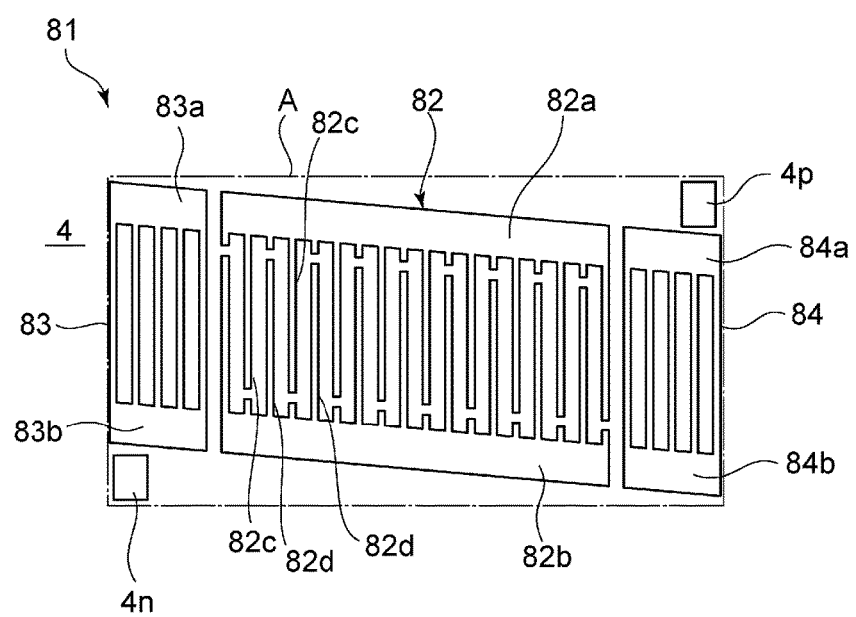
FIG. 8 is a schematic plan view of a portion provided in an IDT electrode of an elastic wave device according to an eighth preferred embodiment of the present invention.

FIG. 8 is a schematic plan view illustrating a portion in which a functional electrode for an elastic wave device of an elastic wave device 81 according to the eighth preferred embodiment is provided. Reflectors 83 and 84 are provided on both sides in the elastic wave propagation direction of an IDT electrode 82 in the elastic wave device 81. Apodization weighting is not performed on the IDT electrode 82.

A first busbar 82a and a second busbar 82b are extended in an oblique direction intersecting with the elastic wave propagation direction. A plurality of first electrode fingers 82c and a plurality of second electrode fingers 82d are alternately inserted into each other. The elastic wave propagation direction is a direction perpendicular or substantially perpendicular to a direction in which the first electrode fingers 82c and second electrode fingers 82d extend. In the first and second busbars 82a and 82b, both a side in an inner side portion where one end of each of the first electrode fingers 82c or the second electrode fingers 82d is connected and a side in an outer side portion are extended in a direction obliquely intersecting with the elastic wave propagation direction. Also in the reflectors 83 and 84, busbar sections 83a and 84a short-circuiting a plurality of electrode fingers are each present at a position on a line extended in a direction in which the first busbar 82a extends. Busbar sections 83*b* and 84*b* are each present at a position on a line extended in the elastic wave propagation direction of the second busbar 82*b*. Accordingly, the short-circuiting busbar sections 83*a*, 83*b* and 84*a*, 84*b* of the reflectors 83 and 84 also obliquely intersect with the elastic wave propagation direction. In the case of the functional electrode for an elastic wave device including the IDT electrode 82 and the reflectors 83 and 84 as discussed above, a minimum rectangular or substantially rectangular region A encompassing the functional electrode for an elastic wave device takes a shape as indicated by a dot-dash line. Also in this preferred embodiment, the minimum rectangular or substantially rectangular region A includes a pair of sides extending in parallel or substantially in parallel to the elastic wave propagation direction.

Passing-through sections 4*n* and 4*p* are provided in the minimum rectangular or substantially rectangular region A. In this case, the minimum rectangular or substantially rectangular region A includes a pair of long sides extending in the elastic wave propagation direction and a pair of short sides connecting both ends of the pair of long sides. In each of the reflectors 83 and 84, a relatively large space is present between the reflector and one long side of the minimum rectangular or substantially rectangular region A. As such, the passing-through sections 4*n* and 4*p* are each able to be positioned with ease in the above-mentioned space as shown in the drawing.

The passing-through sections 4*n* and 4*p* are each positioned in an end portion in the elastic wave propagation direction inside the rectangular region A. Accordingly, also in this preferred embodiment, the miniaturization is able to be realized without noticeably decreasing the excitation efficiency of elastic waves.

Although the functional electrode for an elastic wave device including the IDT electrode preferably is provided on a first principal surface 4*a* of a piezoelectric substrate 4, it may be provided on a second principal surface 4*b* thereof. This structure is applicable to the first to seventh preferred embodiments.

Further, the passing-through sections 4*n* and 4*p* may be each provided in a region between the electrode fingers that are adjacent to each other within the ID electrode 82, or in a region between the electrode fingers that are adjacent to each other within the reflector 83 or 84.

Next, manufacturing methods for elastic wave devices of various preferred embodiments of the present invention will be described taking a manufacturing method for the elastic wave device of the first preferred embodiment as an example.

Figure 9A:
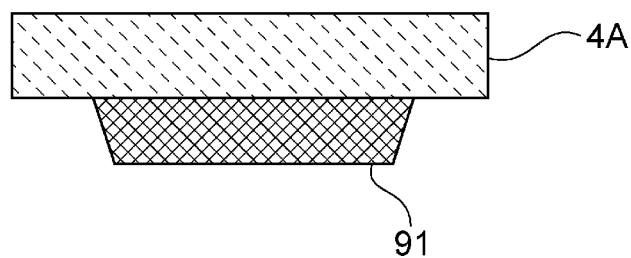
FIGS. 9A to 9C are cross-sectional front views for explaining a manufacturing process of the elastic wave device according to the first preferred embodiment of the present invention.

First, as shown in FIG. 9A, a wafer 4A formed with LiTaO$_3$ is prepared. Then, a sacrificial layer 91 is formed on one principal surface of the wafer 4A. The sacrificial layer 91 can be formed by depositing Cu, for example. The sacrificial layer 91 can include an appropriate material that is eliminated by etching.

Figure 9B:
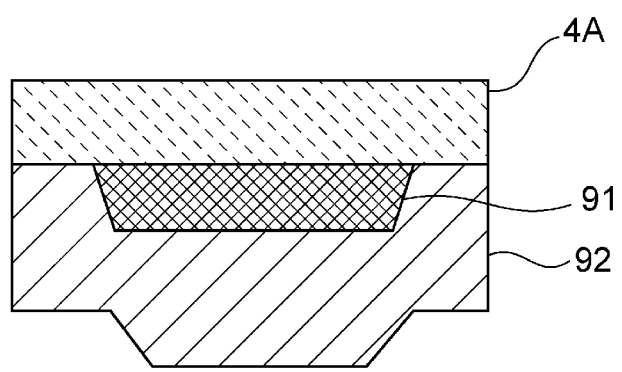

Next, as shown in FIG. 9B, after the formation of the sacrificial layer 91, a silicon oxide film 92 is formed by sputtering or the like so as to configure a support substrate.

Figure 9C:
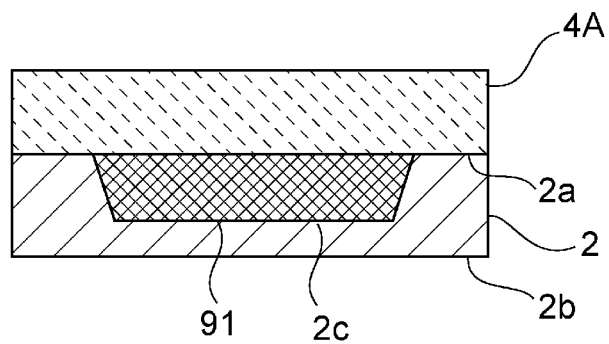

Next, as shown in FIG. 9C, the silicon oxide film 92 is polished, and the support substrate 2 is obtained. With this, in the support substrate 2, the recess 2*c* that is opened toward the upper surface 2*a* is filled with the sacrificial layer 91.

Figure 10A:
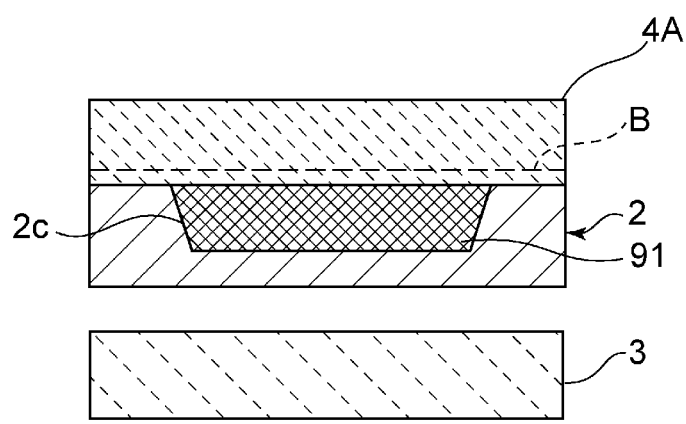
FIGS. 10A and 10B are cross-sectional front views for explaining the manufacturing process of the elastic wave device according to the first preferred embodiment of the present invention.
Figure 10B:
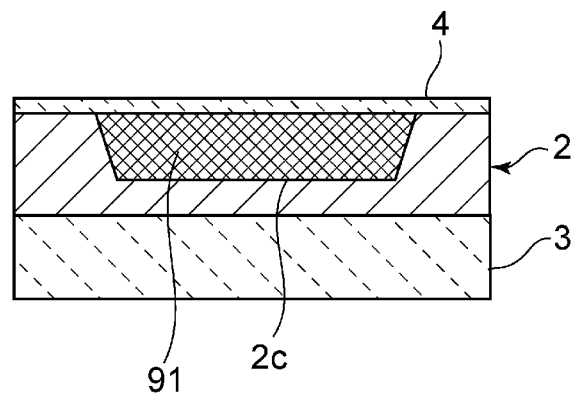

Next, as shown in FIG. 10A, the reinforcement substrate 3 is bonded to the support substrate 2. Subsequently, a surface of the wafer 4A on a side where the IDT electrode 6 is to be formed is polished by a polishing machine. In the process of polishing, the wafer 4 is polished down to a level of position indicated by a broken line B in FIG. 10A, thus making the wafer 4 be thinned. In this manner, as shown in FIG. 10B, obtained is a structure in which the piezoelectric substrate 4 formed of a piezoelectric thin film is laminated on the support substrate 2.

Figure 11A:
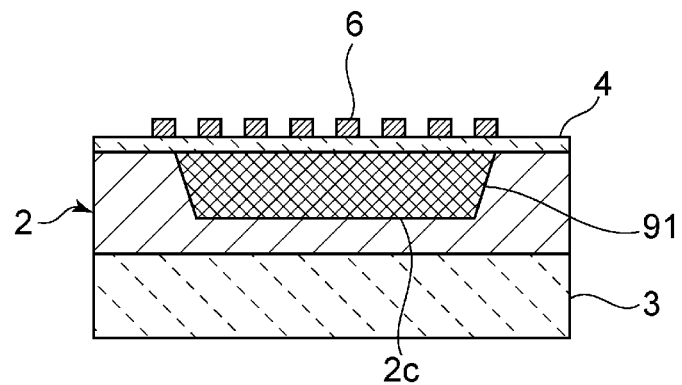
FIGS. 11A to 11C are cross-sectional front views for explaining the manufacturing process of the elastic wave device according to the first preferred embodiment of the present invention.

Thereafter, as shown in FIG. 11A, an electrode structure including the IDT electrode 6 on the piezoelectric substrate 4 is formed.

Figure 11B:
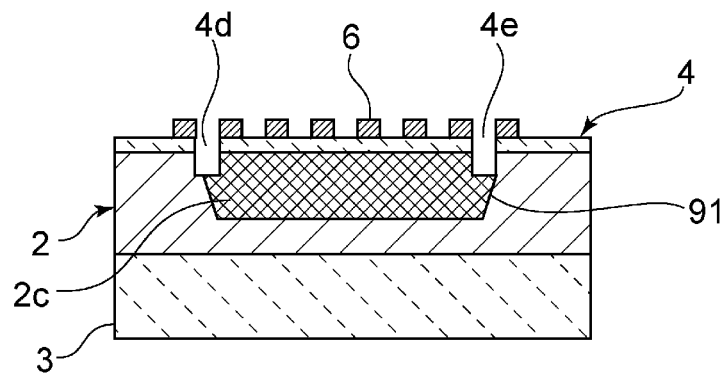
Figure 11C:
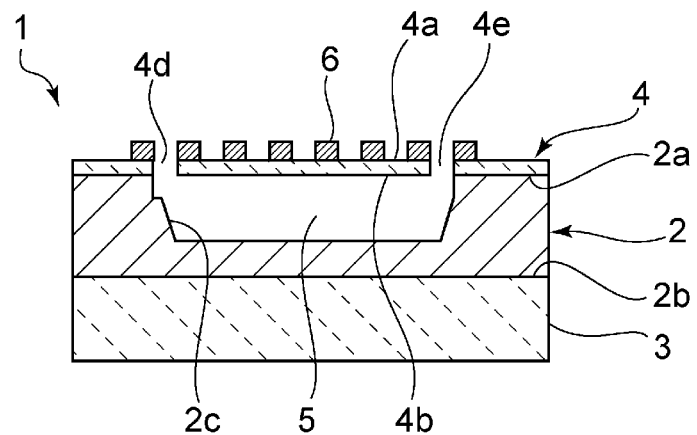

Next, as shown in FIG. 11B, drilling operation is carried out by laser or the like so as to form holes passing through the piezoelectric substrate 4. The passing-through sections 4*d* and 4*e* are provided in this manner. Thereafter, the sacrificial layer 91 is removed with an etchant that removes the sacrificial layer 91. In this manner, as shown in FIG. 11C, the elastic wave device 1 can be obtained.

It is to be noted that the methods of manufacturing the elastic wave devices according to various preferred embodiments of the present invention are not limited to the manufacturing method of the present preferred embodiment. In addition, the elastic wave devices to which various preferred embodiments of the present invention are applicable are not limited to those making use of plate waves, and may be those making use of other waves. Moreover, preferred embodiments of the present invention are applicable to elastic wave devices with various types of circuit configurations including not only an elastic wave resonator but also an elastic wave filter in which a plurality of elastic wave resonators are connected, and the like.

Further, the elastic wave devices of various preferred embodiments of the present invention are widely used in various types of electronic apparatuses, communication apparatuses, and so on. A sensor can be cited as an electronic apparatus, for example. As communication apparatuses, for example, a duplexer including one of the elastic wave devices according to various preferred embodiments of the present invention, a communication module apparatus including one of the elastic wave devices according to various preferred embodiments of the present invention and a PA (Power Amplifier) and/or a LNA (Low Noise Amplifier) and/or a SW (Switch), a mobile communication apparatus including the above communication module apparatus, a health care communication apparatus, and so on can be cited. As the mobile communication apparatus, a cellular phone, a smart phone, a car navigation system, or the like can be cited. As the health care communication apparatus, a weighing apparatus, a body fat scale, or the like can be cited. The health care communication apparatus, the mobile communication apparatus, and the like are each provided with an antenna, a RF module, an LSI, a display unit, an input unit, a power supply, and the like.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave device comprising:
  a support substrate including an upper surface including a recess;
  a piezoelectric substrate including a first principal surface and a second principal surface opposing each other, and laminated to cover the recess of the support substrate from the second principal surface side; and
  a functional electrode provided on one of the first and second principal surfaces of the piezoelectric substrate and including at least an interdigital transducer (IDT)

electrode that generates elastic waves, and through which the elastic waves propagate; wherein the recess of the support substrate is covered with the piezoelectric substrate as to define a hollow section;

a passing-through section passing through the first and second principal surfaces of the piezoelectric substrate is provided in the piezoelectric substrate;

the passing-through section is connected to the hollow section; and at least a portion of the passing-through section is positioned inside a minimum rectangular or substantially rectangular region encompassing an outer circumference of a region in which the functional electrode for an elastic wave device is located in plan view from the first principal surface side of the piezoelectric substrate.

2. The elastic wave device according to claim 1, wherein at least a portion of the passing-through section is positioned in an end portion in an elastic wave propagation direction inside the minimum rectangular or substantially rectangular region.

3. The elastic wave device according to claim 1, wherein the functional electrode does not include a reflector.

4. The elastic wave device according to claim 1, wherein the passing-through section is disposed in a region between adjacent electrode fingers of the IDT electrode.

5. The elastic wave device according to claim 1, wherein the functional electrode includes a pair of reflectors disposed on both sides in the elastic wave propagation direction of the IDT electrode.

6. The elastic wave device according to claim 5, wherein the passing-through section is provided in at least one of a region between the adjacent electrode fingers of the IDT electrode and a region between adjacent electrode fingers of the reflector.

7. The elastic wave device according to claim 1, wherein
the IDT electrode includes first and second busbars opposing each other and first and second electrode fingers electrically connected to the first and second busbars respectively; and
the first and second busbars extend in a direction intersecting with the elastic wave propagation direction.

8. The elastic wave device according to claim 1, wherein
the minimum rectangular or substantially rectangular region is larger than a region in which the functional electrode is provided; and
at least a portion of the passing-through section is disposed in an outer side portion of the functional electrode.

9. The elastic wave device according to claim 1, wherein the elastic wave device is structured to generate plate waves.

10. The elastic wave device according to claim 1, further comprising a reinforcement substrate provided on the support substrate.

11. The elastic wave device according to claim 1, wherein at least one other passing-through section is provided in the piezoelectric substrate.

12. The elastic wave device according to claim 1, wherein the passing-through section is provided in a region between electrode fingers of the IDT electrode on an inner side relative to a region between electrode fingers of the IDT electrode on an outermost side in an elastic wave propagation direction inside the minimum rectangular or substantially rectangular region.

13. The elastic wave device according to claim 2, wherein a portion of a dummy electrode finger is omitted in a portion where the passing-through section is located.

14. The elastic wave device according to claim 2, wherein more than one half of the passing-through section is positioned in an end portion in an elastic wave propagation direction inside the minimum rectangular or substantially rectangular region.

15. The elastic wave device according to claim 1, wherein the IDT electrode includes first electrode fingers and dummy electrode fingers spaced by a gap from each of leading ends of the first electrode fingers.

16. The elastic wave device according to claim 1, wherein the IDT electrode includes a first busbar and a second busbar that are not parallel to an elastic wave propagation direction.

17. The elastic wave device according to claim 1, wherein the IDT electrode is rhombic or substantially rhombic.

18. The elastic wave device according to claim 1, wherein the IDT electrode is apodization weighted.

* * * * *